United States Patent
Tanabe et al.

(10) Patent No.: US 8,023,051 B2
(45) Date of Patent: Sep. 20, 2011

(54) TOUCH PANEL WITH ELONGATED FLEXIBLE PRINTED CIRCUIT

(75) Inventors: Hiroshi Tanabe, Tokyo (JP); Seiichi Ishikura, Ebina (JP); Nobuhiko Hosobata, Tokyo (JP)

(73) Assignee: Touch Panel Systems K.K. (JP)

( * ) Notice: Subject to any disclaimer, the term of this patent is extended or adjusted under 35 U.S.C. 154(b) by 777 days.

(21) Appl. No.: 11/661,078

(22) PCT Filed: Aug. 23, 2005

(86) PCT No.: PCT/JP2005/015603
§ 371 (c)(1),
(2), (4) Date: Oct. 22, 2007

(87) PCT Pub. No.: WO2006/022404
PCT Pub. Date: Mar. 2, 2006

(65) Prior Publication Data
US 2008/0231791 A1    Sep. 25, 2008

(30) Foreign Application Priority Data
Aug. 24, 2004 (JP) ................ 2004-243409

(51) Int. Cl.
*G02F 1/1335* (2006.01)
*G06F 3/041* (2006.01)
(52) U.S. Cl. ........... 349/12; 349/150; 345/173; 345/175
(58) Field of Classification Search .......... 349/12, 349/150; 345/175, 173
See application file for complete search history.

(56) References Cited

U.S. PATENT DOCUMENTS

| | | | |
|---|---|---|---|
| 4,737,632 A | 4/1988 | Kawabe et al. | |
| 4,845,479 A | 7/1989 | Marincic | |
| 4,862,153 A * | 8/1989 | Nakatani et al. | 345/80 |
| 4,893,120 A | 1/1990 | Doering et al. | |
| 6,678,112 B1 * | 1/2004 | Kaneko | 360/97.01 |
| 2005/0017956 A1 * | 1/2005 | Mai | 345/173 |
| 2009/0189878 A1 * | 7/2009 | Goertz et al. | 345/175 |

FOREIGN PATENT DOCUMENTS

| | | |
|---|---|---|
| JP | 61-189341 U | 11/1986 |
| JP | 62-289815 A | 12/1987 |
| JP | 63-167925 A | 7/1988 |
| JP | 63-293985 A | 11/1988 |
| JP | 1-206425 A | 8/1989 |
| JP | 2002-324951 A | 11/2002 |

OTHER PUBLICATIONS

Search report for International Application No. PCT/JP2005/015603, mailed Dec. 6, 2005.

* cited by examiner

*Primary Examiner* — Nathanael R Briggs

(57) ABSTRACT

The material utilization efficiency of FPC's is improved, to provide a low cost touch panel. A touch panel 100 is constituted by: a rectangular transparent panel 104; and a plurality of light emitting elements 8a and a plurality of light receiving elements 8b provided at the peripheral portions of the transparent panel 104, for specifying the coordinates of targets of detection. An elongate FPC 106 is folded at a plurality of predetermined locations to be provided as a frame along the four sides 122a, 122b, 122c, and 122d of the transparent panel 104. The plurality of light emitting elements 8a are provided on the FPC 106 along two adjacent sides of the transparent panel 104, and the plurality of light receiving elements 8b are provided on the other two sides of the transparent panel 104 so as to face the light emitting elements 8a.

6 Claims, 9 Drawing Sheets

TOUCH PANEL WITH ELONGATED FLEXIBLE PRINTED CIRCUIT

TECHNICAL FIELD

The present invention relates to an infrared type touch panel, which is used in electronic devices such as ATM's (Automatic Teller Machines) located at banks and convenience stores, ticket vending machines at train stations, and the like.

BACKGROUND ART

Conventionally, there are known devices that employ FPC's (Flexible Printed Circuits) in transparent tablets (touch panels) for inputting X-Y coordinates with fingers (refer to, for example, Japanese Unexamined Patent Publication No. 1(1989)-206425, FIG. 1). The FPC disclosed in the above document is continuously provided so as to surround the four sides at the periphery of a rectangular transparent substrate (transparent panel), which functions as an input portion of the transparent tablet. The FPC is formed in a frame shape by punching out a rectangular portion that corresponds to a display screen from a rectangular sheet FPC having greater dimensions than the display screen. The frame shaped portion is provided at the periphery of the transparent substrate, and electronic components necessary for the touch panel are provided on the frame shaped portion.

A circuit unit is also known, in which a single FPC is folded along two adjacent sides of a rectangular display screen of a plasma display device, a liquid crystal display device or the like (refer to, for example, Japanese Unexamined Patent Publication No. 2002-324951, FIG. 5).

In the case of the FPC disclosed in Japanese Unexamined Patent Publication No. 1-206425, it is easy to provide light emitting elements and light receiving elements such that their correspondent relationships are accurately established. However, the rectangular portion of the FPC which is punched out constitutes a large portion of the sheet FPC that it is punched out from. The punched out portion is generally discarded instead of being utilized. That is, the discarded portion becomes waste, the material utilization efficiency of FPC's, becomes low, and as a result, the cost of production becomes high. Even if the portion to be discarded is to be utilized for other applications, there are problems with regard to production and parts management. In addition, not all of the portions to be discarded can be utilized for other applications.

In the case of the FPC disclosed in Japanese Unexamined Patent Publication No. 2002-324951, the area of the FPC to be utilized can be maintained small. However, this configuration is difficult to be applied to a touch panel, in which an FPC is provided along the four sides of a rectangular transparent panel, and pluralities of light emitting elements and light receiving elements that correspond to each other are provided on the four sides.

The present invention has been developed in view of the foregoing circumstances. It is an object of the present invention to provide a touch panel, in which the material utilization efficiency of FPC's is high, which can be manufactured at low cost, and in which the correspondent relationships among pluralities of light emitting elements and light receiving elements can be accurately established.

DISCLOSURE OF THE INVENTION

The touch panel of the present invention comprises:
a rectangular transparent panel; and
a plurality of light emitting elements and a plurality of light receiving elements provided at the peripheral portions of the transparent panel 104, for specifying the coordinates of targets of detection; and is characterized by:

an elongate FPC being folded at a plurality of predetermined locations to be provided as a frame along the four sides of the transparent panel; and the plurality of light emitting elements being provided on the FPC along two adjacent sides of the transparent panel, and the plurality of light receiving elements being provided on the other two sides of the transparent panel so as to face the light emitting elements.

Here, the "transparent panel" refers to those that exhibit transmittance with respect to light of 90% or greater, by providing an anti-reflectance coating, an anti-bacterial coating, or a hard coating on the surface of the transparent panel, in addition to those that exhibit 100% transmittance with respect to light.

A light emitting element mounting surface, at which the light emitting elements are mounted on the FPC, and a light receiving element mounting surface, at which the light receiving elements are mounted on the FPC, may be parallel to the main surface of the transparent panel and provided on opposite sides with respect to each other.

A frame shaped bezel may be provided on the periphery of the transparent panel; one of the light emitting element mounting surface and the light receiving element surface may be provided on the upper surface of the bezel; and the other of the light emitting element mounting surface and the light receiving element surface may be provided on the lower side of the bezel.

The FPC may be mounted onto the bezel by double sided adhesive tape.

According to the infrared type touch panel of the present invention, the elongate FPC is folded at the plurality of predetermined locations to be provided as a frame along the four sides of the transparent panel, the plurality of light emitting elements are provided on the FPC along two adjacent sides of the transparent panel, and the plurality of light receiving elements being provided on the other two sides of the transparent panel so as to face the light emitting elements. Therefore, the touch panel of the present invention exhibits the following advantageous effects.

The necessary FPC can be obtained from a material having a much smaller area than the touch panel, and the amount of wasted material is extremely small. Therefore, the material utilization efficiency of the FPC is high, and the touch panel can be manufactured at low cost.

A configuration may be adopted, wherein: a light emitting element mounting surface, at which the light emitting elements are mounted on the FPC, and a light receiving element mounting surface, at which the light receiving elements are mounted on the FPC, being parallel to the main surface of the transparent panel and provided on opposite sides with respect to each other. In this case, the correspondent relationships among the light emitting elements and the light receiving elements can be easily established, even if the mounting surfaces for the elements are inverted by folding of the FPC, due to the flexibility thereof.

A configuration may be adopted, wherein: a frame shaped bezel is provided on the periphery of the transparent panel; one of the light emitting element mounting surface and the light receiving element surface is provided on the upper surface of the bezel; and the other of the light emitting element mounting surface and the light receiving element surface is provided on the lower side of the bezel. In this case, the correspondence among the light emitting elements and the light receiving elements can be easily and accurately established.

The FPC may be mounted onto the bezel by double sided adhesive tape. In this case, the FPC can be easily mounted onto the bezel.

DETAILED DESCRIPTION OF THE INVENTION

Figure 1:
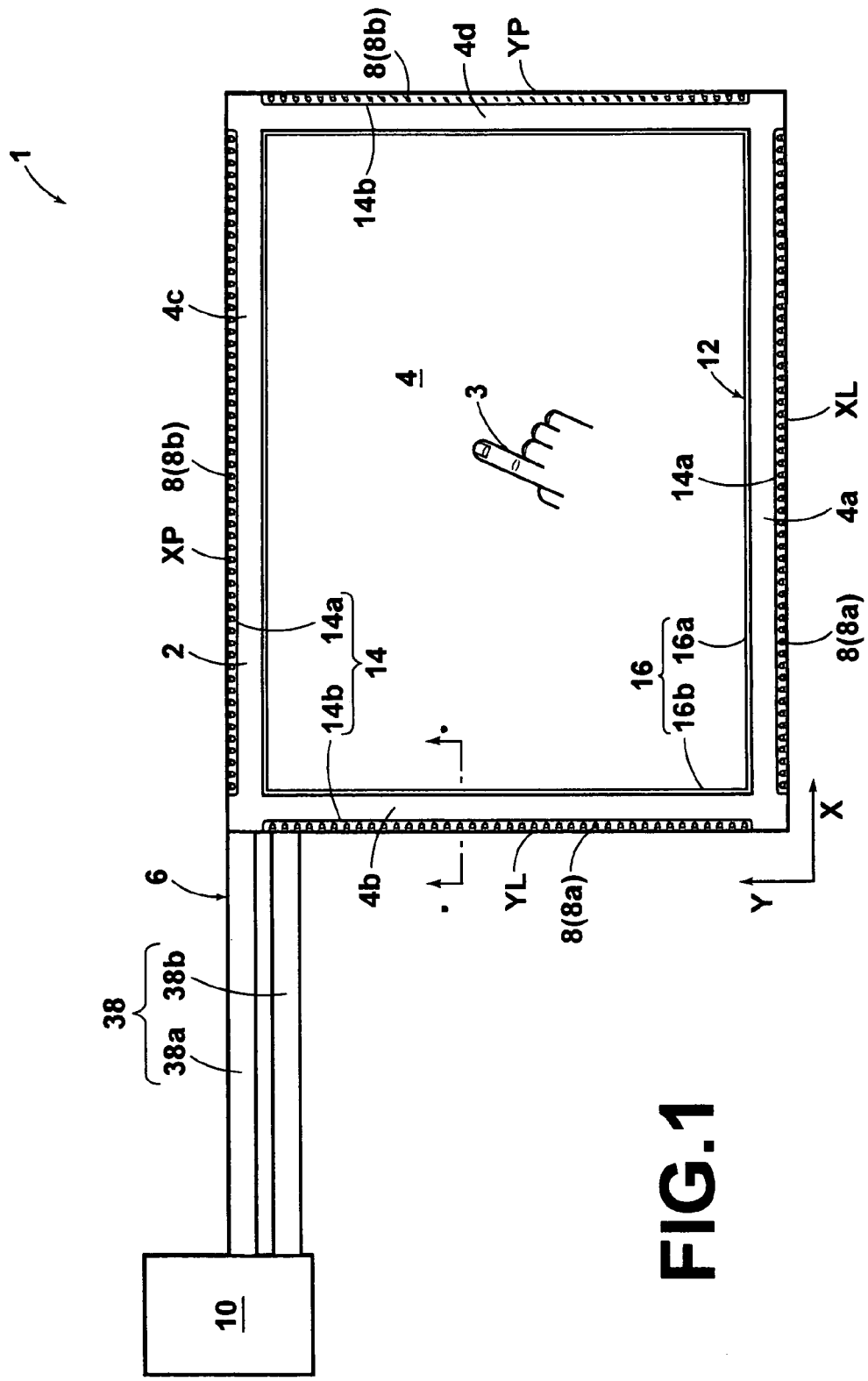
FIG. 1 is a plan view that illustrates a touch panel according to a first embodiment of the present invention, along with a control board for controlling the touch panel.
Figure 2:
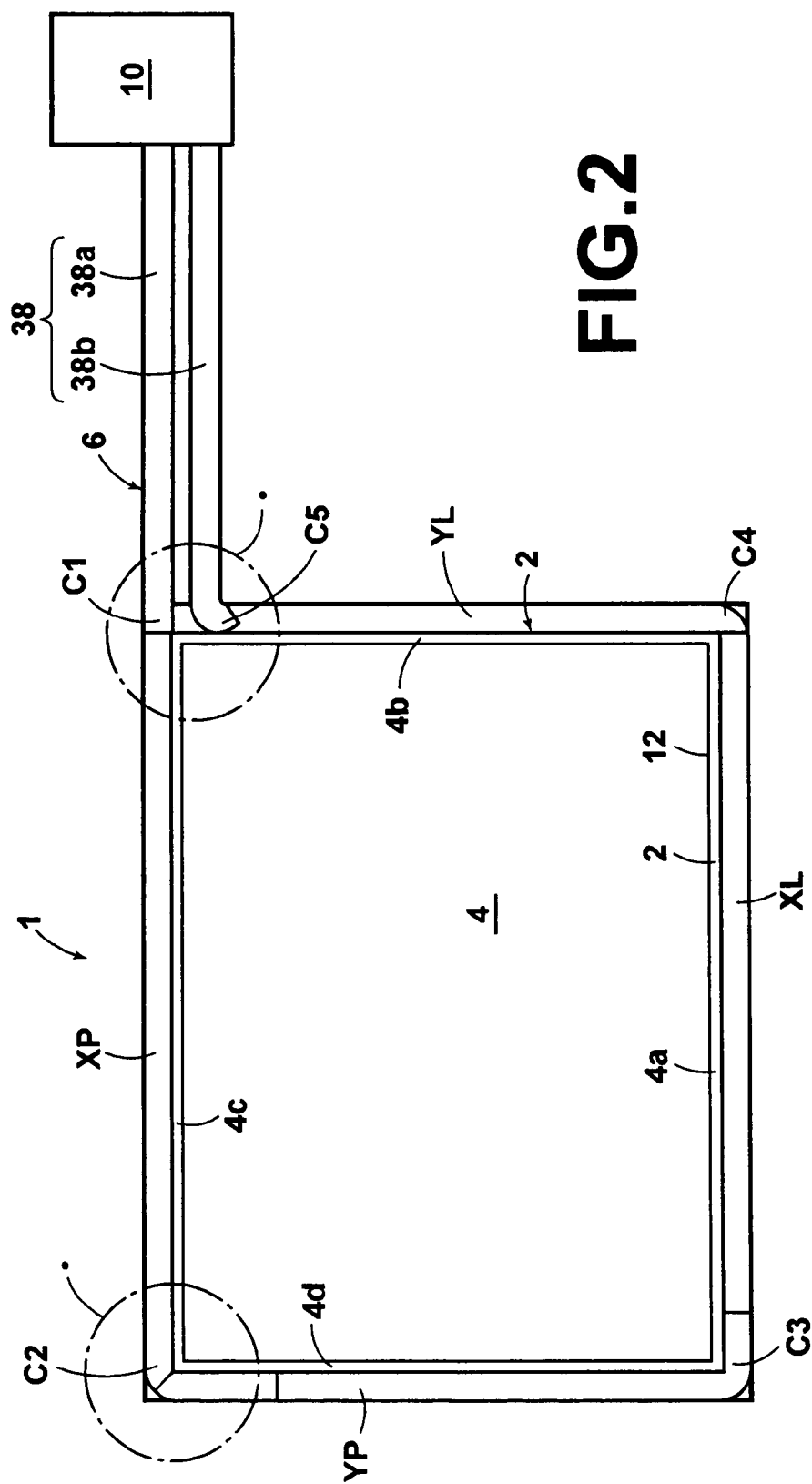
FIG. 2 is a bottom view of the touch panel of FIG. 1.
Figure 3:
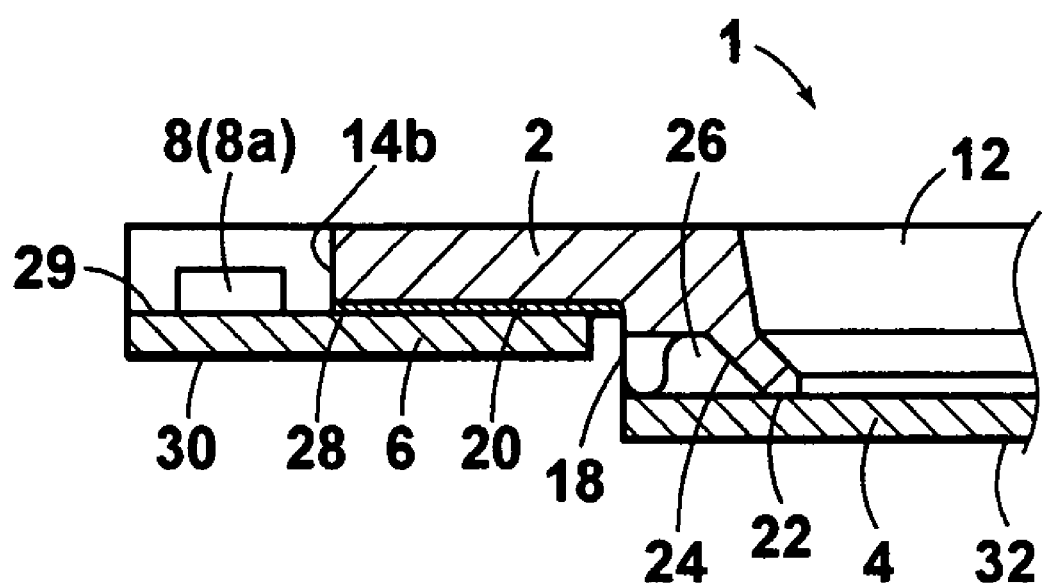
FIG. 3 is a partial magnified sectional view of the touch panel, taken along line III-III of FIG. 1.

Hereinafter, embodiments of the touch panel of the present invention will be described with reference to the attached drawings. FIG. 1 is a plan view that illustrates a touch panel 1 according to a first embodiment of the present invention, along with a control board for controlling the touch panel. FIG. 2 is a bottom view of the touch panel 1 of FIG. 1. FIG. 3 is a partial magnified sectional view of the touch panel 1, taken along line III-III of FIG. 1. The touch panel 1 according to the first embodiment will be described with reference to FIGS. 1 through 3. The touch panel 1 is an infrared type touch panel, comprising: a plastic frame shaped bezel 2; a display panel, that is, a transparent panel 4, which is mounted on the bezel 2; an FPC 6 mounted on the bezel 2; and a plurality of elements 8 which are provided on the FPC 6. Input to the touch panel 1 is performed by placing a finger 3 (detection target) in contact with the transparent panel 4. The FPC 6 is electrically connected to a control board via a connector (not shown). The control board 10 communicates coordinate data with a host computer (not shown), such as a personal computer. A control board suited for an interface of the host computer is employed.

The bezel 2 is molded from a polycarbonate resin or ABS resin, for example. The bezel 2 has a rectangular open portion 12 at the center thereof, and long cutouts 14 (14a and 14b) along the outer periphery of all four sides thereof. The lengths of the cutouts 14 substantially correspond to those of the inner edges 16 of the open portion 12. That is, the cutouts 14a along the X axis of FIG. 1 are substantially of the same length as the inner edges 16a of the open portion 12, and the cutouts 14b along the Y axis of FIG. 1 are substantially of the same length as the inner edges 16b of the open portion 12. Note that the X and Y axes are indicated by arrows.

As illustrated in FIG. 3, the front surface of the bezel 2 that faces users, that is, the upper surface in FIG. 3, is flat, while a step 18 is formed on the rear surface thereof, that is, the lower surface in FIG. 3. The step 18 is formed to protrude downward from an FPC mounting surface 20 on the rear surface of the bezel 2. A downwardly facing panel mounting surface 22 is formed by the step 18. A groove 24, which is open downwardly and to the side along the inner edges 16 of the open portion 12, is formed in the panel mounting surface 22. The transparent panel 4 is molded from an acrylic resin, for example, and is adhesively attached to the panel mounting surface 22 by adhesive or double sided adhesive tape. Note that in the case that in the case that the space between the bezel 2 and the panel 4 is required to be dustproof, waterproof, and possess resistance to climatic conditions, a filler 26 may be injected into the groove 24 from the side of the step 18. No screws are required to mount the transparent panel 4 onto the bezel 2, and assembly is facilitated.

The FPC is adhesively attached to the FPC mounting surface 20 of the bezel 2 by double sided adhesive tape 28, as illustrated in FIG. 3. At this time, rows of the elements 8 are provided such that they are arranged within the cutouts 14, as illustrated in FIG. 1. In addition, the lower surface 30 of the FPC 6 is configured such that it does not protrude beyond the lower surface 32 of the transparent panel 4. In other words, the transparent panel 4 is positioned sufficiently beneath the FPC mounting surface 20 by the step 18 being provided, such that the FPC can be housed within the space between the FPC mounting surface 20 and the lower surface 32 of the transparent panel 4, even if the thickness of the FPC 6 increases due to it being folded. Thereby, interference between the casing and the FPC 6 can be prevented, when the lower surface 32 of the transparent panel 4 is mounted onto a casing (not shown) of the touch panel 1. The elements 8 are provided within the cutouts 14 of the bezel, thereby enabling the touch panel 1 to have a low profile.

As described previously, the rows of the elements 8 are arranged within the cutouts 14 when the FPC 6 is mounted onto the bezel 2 by the double sided adhesive tape 28. The elements 8 comprise a plurality of light emitting elements 8a and a plurality of light receiving elements 8b. The light emitting elements 8a are light emitting diodes that emit infrared light, and are provided along sides 4a and 4b, which are the bottom and left sides of the bezel 2 in FIG. 1. The light receiving elements 8b are photodiodes, and are provided along sides 4c and 4d, which are the top and right sides of the bezel 2 in FIG. 1. The light emitting diodes 8a are configured to emit infrared rays toward the light receiving elements 8b facing them across the open portion 12. For example, the element 8a illustrated in FIG. 3 is positioned within the cutout 14b in the left side 4b, and is configured to emit infrared light toward the right, that is, toward the open portion 12. The bezel 2 is colored black, to facilitate transmission of infrared light while eliminating influence from visual light incident thereon from the exterior. In addition, the reason why the light receiving elements 8b are mounted on the upper side 4c is to prevent external light, such as sunlight, from directly being incident thereon. Thereby, malfunction of the touch panel 1 due to infrared components of sunlight being incident on the light receiving elements 8b can be prevented.

Figure 4:
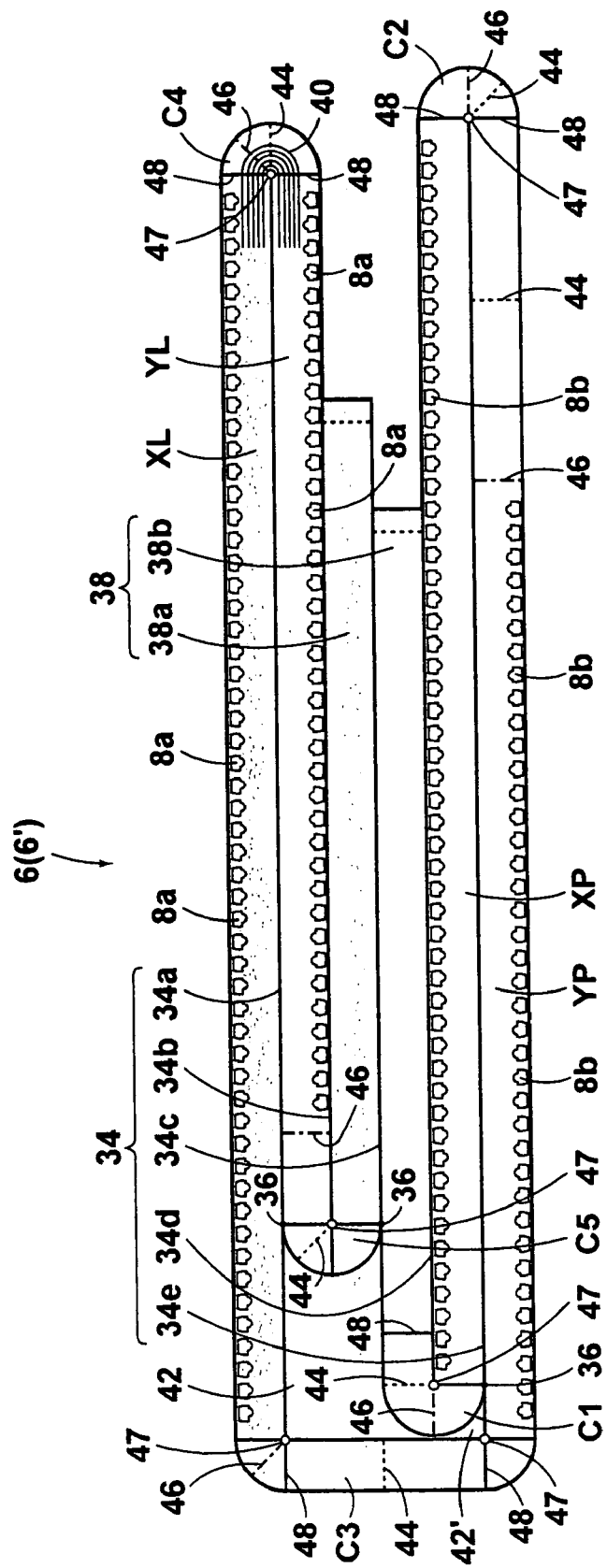
FIG. 4 is a plan view of an FPC to be used in the touch panel of FIG. 1, in an aggregate form during an initial manufacturing stage.
Figure 5:
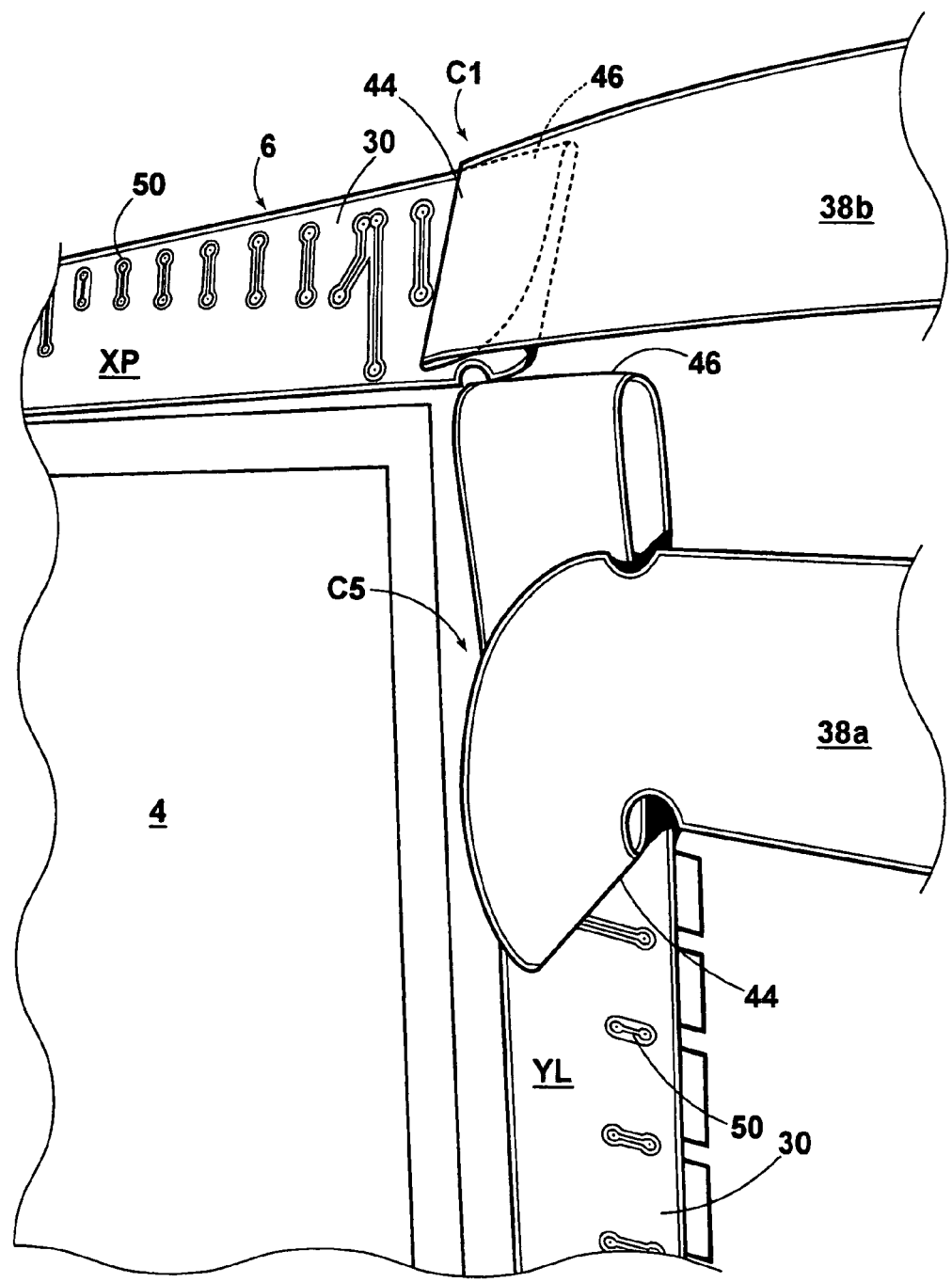
FIG. 5 is a partial magnified view of a folded portion of the FPC indicated by V in FIG. 2.
Figure 6:
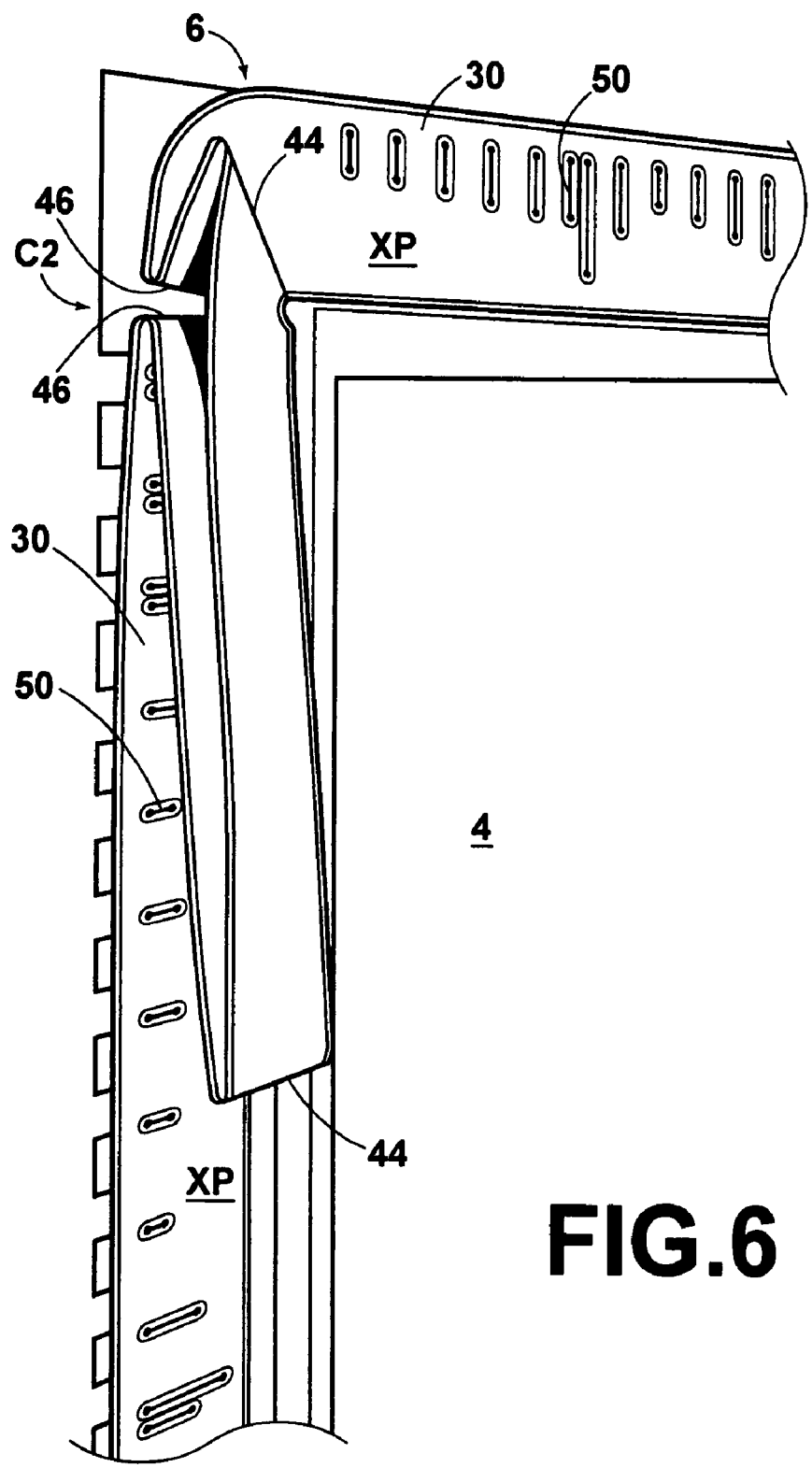
FIG. 6 is a partial magnified view of a folded portion of the FPC indicated by VI in FIG. 2.

Next, the FPC 6 which is utilized in the touch panel 1 will be described with reference to FIG. 2, FIG. 4, FIG. 5, and FIG. 6. FIG. 4 is a plan view of the FPC 6 utilized in the touch panel of FIG. 1, in an aggregate form during an initial manufacturing stage (hereinafter, referred to as "aggregate FPC 6'"). FIG. 5 is a partial magnified view of a folded portion of the FPC 6 indicated by V in FIG. 2. FIG. 6 is a partial magnified view of a folded portion of the FPC 6 indicated by VI in FIG. 2.

First, a description will be given with reference to FIG. 4. The FPC 6 is formed by first punching out a sheet FPC into a shape illustrated in FIG. 4, to obtain an aggregate FPC 6'. The size of the aggregate FPC 6' is smaller than that of the open portion 12. In this stage, five slits 34 (34a, 34b, 34c, 34d, and 34e) are formed in the aggregate FPC 6' in the longitudinal direction thereof. The slits 34 separate adjacent portions of the aggregate FPC 6', to enable formation of a single continuous elongate FPC 6. Note that the portions denoted by 42 and 42' in FIG. 4 indicate portions where the FPC 6 has been punched out. At this stage, there are a number of point-like portions at which the slits 34 are not formed. These point-like portions are linking portions 36, for linking adjacent band shaped portions of the aggregate FPC 6' to each other. The linking portions 36 prevent the band shaped portions of the aggregate FPC 6' from separating, and maintain the shape thereof such that the band shaped portions are in close contact with each other, as illustrated in FIG. 4. A printed circuit 40 is already provided along the entire length of the FPC 6 at this stage. Note that only a portion of the printed circuit 40 is illustrated in FIG. 4, and the remaining portions of the printed circuit 40 have been omitted.

The FPC 6 is constituted by band shaped portions XL, YL, XP, and YP that extend in the longitudinal direction of the aggregate FPC 6', linking portions C1, C2, C3, C4, and C5 that link the band shaped portions, and connecting portions 38 (38a and 38b) which are connected to the control board 10. The band shaped region XL of the aggregate FPC 6' corresponds to the lower side 4a of the bezel 2, and a great number of light emitting elements 8a are fixed at predetermined intervals thereon by soldering. The band shaped portion YL corresponds to the left side 4b, and a great number of light emitting elements 8a are similarly fixed at predetermined intervals thereon by soldering.

On the other hand, the band shaped portion XP corresponds to the upper side 4c, and a great number of light receiving elements 8b are arranged and fixed thereon. The band shaped portion YP corresponds to the right side 4d, and a great number of light receiving elements 8b are similarly arranged and fixed thereon. The rows of light emitting elements 8a and light receiving elements 8b are provided such that they are positioned in the cutouts 14a and 14b, and face each other. The light emitting elements 8a and the light receiving elements 8b are provided on surfaces of the aggregate FPC 6' on the same side. Of the aggregate FPC 6', the only portions which are discarded are the aforementioned punched out portions 42 and 42'. That is, 80% to 90% of the aggregate FPC 6' can be effectively utilized as the FPC 6.

Broken lines 44 and 46 are printed on the linking portions C1 through C5 so as to cross the width of the band shaped portions. The broken lines 44 and 46 indicate folding lines for forming the aggregate FPC 6' into the FPC 6, wherein the broken lines 44 indicate concave folds and the broken lines 46 indicate convex folds. That is, the FPC 6 is folded in the same manner as origami such that the broken lines 44 become concave and the broken lines 46 become convex, to form a frame shape to fit about the outer periphery of the transparent panel 4. Note that the solid lines which are drawn on the linking portions C1 through C5 such that they cross the band shaped portions of the FPC 6 are positioning lines 48 that function as references when the FPC 6 is mounted onto the bezel 2. It is preferable that the folding operations be performed by a jig (not shown) in order to obtain accurate folds. Apertures 47 are formed at the centers of the arcuate portions of the linking portions C1 through C5. The apertures 47 engage pins of the jig, to position the aggregate FPC 6' with respect to the jig.

When the FPC 6, which has been formed into the frame shape as described above, is mounted onto the bezel 2, the state illustrated in FIG. 2 is achieved. In FIG. 2, the folded portions corresponding to the linking portions C1 and C5 are denoted by V, and the folded portion corresponding to the linking portion C2 is denoted by VI. The folded portions V and VI will be described with reference to FIGS. 5 and 6, respectively. FIG. 5 clearly illustrates how a convex fold and the concave fold at the linking portion C1 cause the positional relationship between the connecting portion 38b and the band shaped portion XP is shifted 180° to become linear. FIG. 5 also illustrates how a convex fold and a concave fold at the linking portion C5 cause the connecting portion 38a and the band shaped portion YL to both become inverted and at a 90° angle with respect to each other. Note that circuits 50, which are formed substantially perpendicular with respect to the longitudinal direction of the FPC 6, are provided to connect predetermined circuits of the FPC 6 with the bottom surface 30 thereof.

Similarly, FIG. 6 clearly illustrates how a convex fold and a concave fold at the linking portion C2 cause the band shaped portion XP and the band shaped portion YP to be at a 90° angle with respect to each other. Although the other linking portions C3 and C4 are not illustrated in the figures, they are also folded in the same manner as origami, to form the FPC 6 into a frame shape as a whole.

As can be seen from FIGS. 2, 5, and 6, no electronic components are mounted on the FPC 6 other than the elements 8. Therefore, the area of the FPC 6 can be small, that is, a narrow FPC can be employed. Accordingly, the frame of the bezel 2 can also be made narrow, and an apparatus that utilizes the touch panel 1 can be miniaturized. Therefore, a large display screen can be obtained with a small apparatus, and the apparatus can be provided even in cases that the installation space therefor is small. The other electronic components are provided in the control board 10 illustrated in FIG. 1 and FIG. 2. Accordingly, mounting of the electronic components onto both the FPC 6 and the control board 10 can be avoided, and the mounting of the electronic components can be performed efficiently.

As described above, in the touch panel 1 according to the first embodiment of the present invention, the area of the utilized FPC is smaller than the area of the transparent panel, and the material cost of the FPC 6 is suppressed. Accordingly, the infrared touch panel 1 can be manufactured at low cost.

Figure 7:
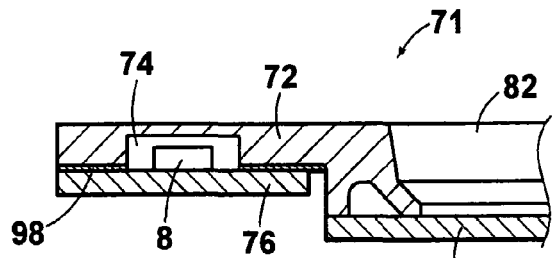
FIG. 7 is a partial magnified sectional view of an infrared type touch panel according to an alternate embodiment of the present invention, corresponding to FIG. 3.

In the first embodiment, the elements 18 were provided in the cutouts 14 of the bezel 2. Alternatively, a configuration may be adopted like that of a touch panel 71 illustrated in FIG. 7. FIG. 7 is a partial magnified sectional view of an infrared type touch panel according to an alternate embodiment of the present invention, corresponding to FIG. 3. The alternate embodiment of FIG. 7 comprises: a bezel 72, a transparent panel 4', an FPC 76 and elements 8. A groove 74 is formed in the bezel 72 along the inner edge of an opening portion 82, and the elements 8 mounted on the FPC 76 are provided within the groove 74. The FPC 76 is mounted onto the bezel 72 by double sided adhesive tape 98 in this case as well. In this alternate embodiment, the elements 8 are completely housed within the groove 74, and therefore will not be damaged by external forces, dust, rain, or the like.

Figure 8:
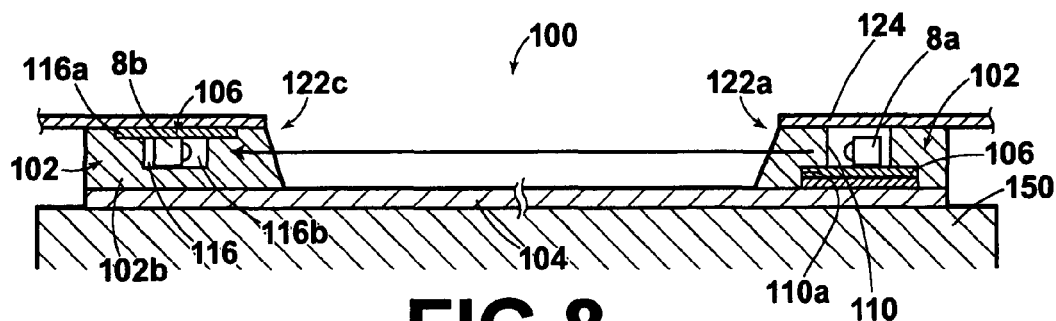
FIG. 8 is a magnified sectional view of a touch panel according to a second embodiment of the present invention.
Figure 9:
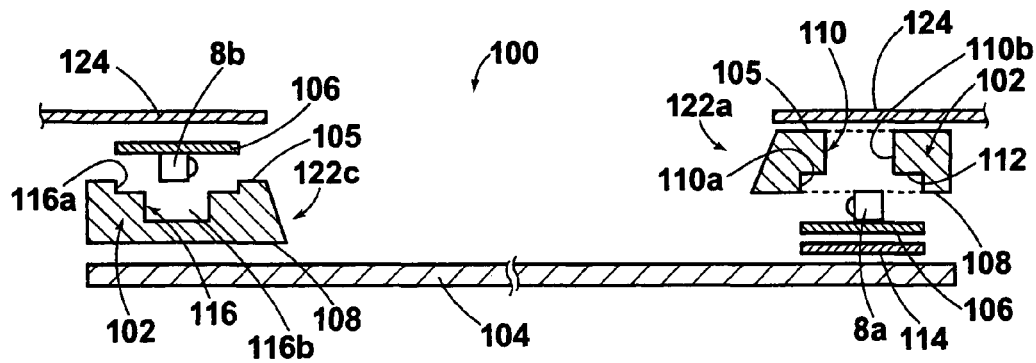
FIG. 9 is an exploded sectional view of the touch panel of FIG. 8.
Figure 10:
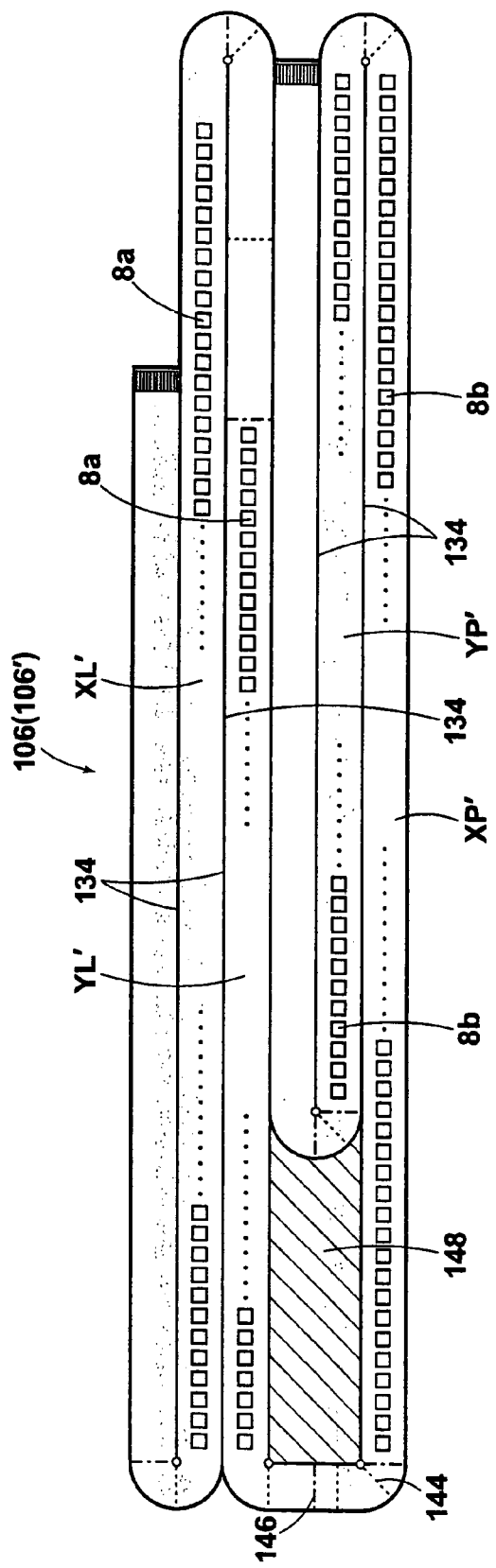
FIG. 10 is a plan view of an FPC to be used in the touch panel of FIG. 8, in an aggregate form during an initial manufacturing stage.
Figure 11:
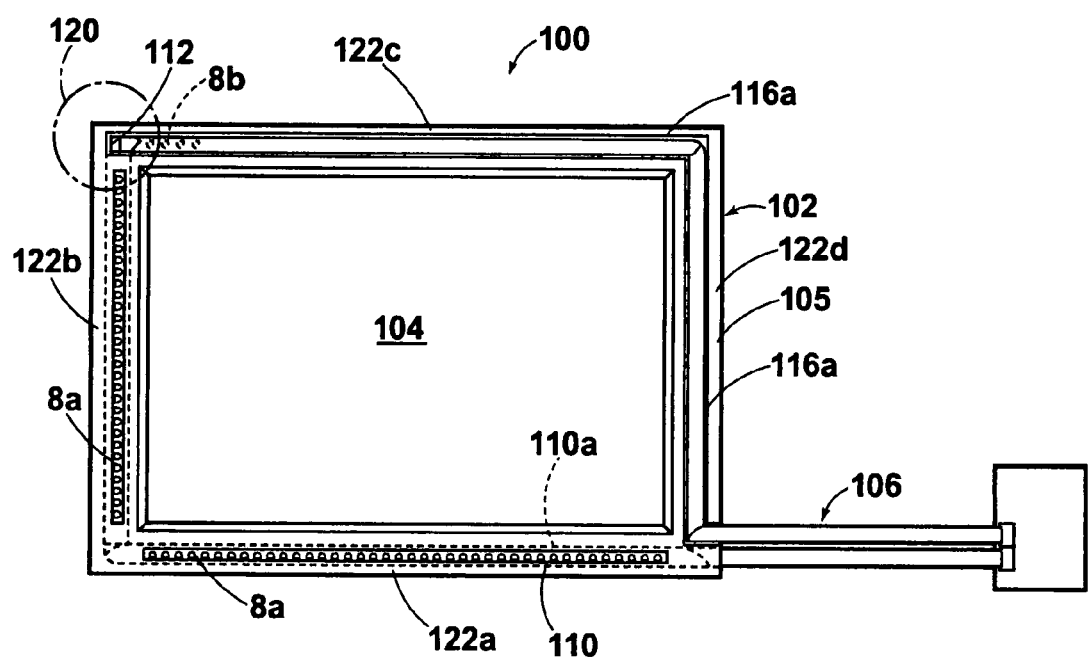
FIG. 11 is a front view of the touch panel according to the second embodiment, from the viewpoint of a user.

Next, a touch panel 100 according to a second embodiment of the present invention will be described with reference to FIGS. 8 through 11. FIG. 8 is a magnified sectional view of the touch panel 100. FIG. 9 is an exploded sectional view of the touch panel 100. FIG. 10 is a plan view of an FPC 106 to be used in the touch panel 100, in an aggregate form during an initial manufacturing stage (hereinafter, referred to as "aggregate FPC 106'''"). FIG. 11 is a front view of the touch panel 100 according to the second embodiment, from the viewpoint of a user. First, a description will be given with reference to FIG. 8 and FIG. 9. The touch panel 100 is provided on top of a display apparatus 150, such as a liquid crystal display device. A transparent panel 104 is provided on top of the display apparatus, and a bezel 102 is provided about the outer periphery of the transparent panel 104. Light emitting elements 8a and light receiving elements 8b are mounted on sides of the bezel 102 that face each other. The touch panel 100 of the second embodiment differs from the touch panel 1 of the first embodiment in that a mounting surface, on which the light emitting elements 8a are mounted, and a mounting surface, on which the light receiving elements 8b are mounted, are oriented inversely with respect to the bezel 102.

An opening 110 that penetrates through the top surface 105 to the bottom surface 108 of the bezel 102 is formed, for example, in a side 122a, at which the light emitting elements 8a are provided. The opening 110 also extends in the longitudinal direction of the side 122a. The portion of the opening 110 toward the bottom surface 108 is of a width that accommodates the FPC 106, and functions as an FPC housing portion 110a. A step 112 is provided above the FPC housing portion to form an element housing portion 110b, which is narrower than the FPC housing portion 110a, toward the top surface 105. The FPC 106, on which the light emitting elements 8a are mounted, is housed within FPC housing portion 110a of the opening 110. The FPC is mounted onto the transparent panel 104 via a cushioning tape 101. The components described above are adhesively attached to each other by double sided adhesive tape (not shown) in a manner similar to that in the first embodiment.

A groove 116 is formed in the top surface 105 of the bezel 102 at the side 122c that faces the side 122a. An FPC housing portion 116a is formed toward the top surface 105 of the groove 116, and a narrow grooved element housing portion 116b is formed toward the bottom surface 108. The FPC 106, on which the light receiving elements 8b are mounted, is mounted within the groove 116 with the light receiving elements 8b on the bottom thereof. A surface mounted resin covering 124, for preventing transmission of infrared components of external light, is mounted on the top surface 105 of the bezel 102. The FPC 106 is mounted to the bezel 102 parallel to the transparent panel 104 in this manner. What is important here is that because the FPC 106 is flexible, it is easy to shift the positions of facing edges of the FPC 106 in the vertical direction to accurately align the light emitting elements 8a and the light receiving elements 8b. Note that the member denoted by reference number 124 is a surface resin layer, which is molded from a resin that does not transmit infrared light.

Next, the FPC 106 that enables the configuration described above will be described with reference to FIG. 10. The components of the FPC 106, such as slits 134, broken lines 144 and broken lines 146 are the same as those of the FPC 6 of the first embodiment, and therefore detailed descriptions thereof will be omitted. A great number of light emitting elements 8a are provided at predetermined intervals along the direction of the X axis (refer to FIG. 1) on a band shaped region XL' of the aggregate FPC 106'. Similarly, a great number of light emitting elements 8a are provided at predetermined intervals along the direction of the Y axis on a band shaped region YL' of the aggregate FPC 106'. A great number of light receiving elements 8b are provided at predetermined intervals along the directions of the X and Y axes on band shaped portions XP' and YP', respectively. Note that the hatched portion denoted by reference number 148 indicates a punched out portion which is not utilized. The FPC 106 is folded such that the broken lines 144 become concave and the broken lines 146 become convex, to form a continuous frame shape. The row of light emitting elements 8a and the row of light receiving elements 8b are inverted in arrangement due to the odd number of folds. Thereby, the inverted and stepped arrangement of the elements 8a and 8b can be performed at low cost.

The FPC 106, which has been folded in this manner, is arranged as illustrated in FIG. 11. The bezel 102 is provided about the outer periphery of the transparent panel 104. The FPC housing portion 116a is formed in the top surface 105 of the bezel 102 along the upper side 122c and the right side 122d thereof. The FPC 106 with the light receiving elements 8b on the underside thereof is housed in the FPC housing portion 116a. Meanwhile, the FPC housing portion 110a is formed in the bottom surface 108 of the bezel 102 (refer to FIG. 8 and FIG. 9), and the FPC 106 with the light receiving elements 8a on the upper surface thereof is housed within the FPC housing portion 110a. A rectangular aperture 112 is formed at the corner of the bezel 102 denoted by reference number 120. The aperture 112 penetrates through the groove 116 to the FPC housing portion 110a such that the FPC housing portions 110a and 116a, which are formed on opposite surfaces of the bezel 102, are in communication with each other. The folded portion of the FPC 106 is housed within the aperture 112. Thereby, the continuous FPC 106 can be provided at the top surface 105 and the bottom surface 108 of the bezel 102, along each of the sides 122a, 122b, 122c, and 122d thereof.

The touch panels of the present invention and the FPC's to be used therein have been described in detail above. However, the present invention is not limited to the above embodiments. Various changes and modifications are possible as long as they do not stray from the spirit of the invention. For example, the transparent panels 4, 4' and 104 may be colored to have a filtering function. Alternatively, an anti reflective coating or a hard coating may be provided thereon. As a further alternative, silver powder may be vapor deposited on the transparent panels 4, 4' and 104 to administer an anti bacterial process. In these cases, the transmittance of the transparent panels may decrease to approximately 90%. However, such decrease in transmittance will not take away from the functioning of the present invention. In addition, the transparent panel of the touch panel need not be integrated with the bezel. The transparent panel may be transparent glass, which is provided on an electronic device, such as the glass surface of a CRT of the electronic device.

What is claimed is:

1. A touch panel, comprising:
   a rectangular transparent panel having four sides and a periphery;
   a plurality of light emitting elements and a plurality of light receiving elements provided at the peripheral portions of the transparent panel, for specifying coordinates of targets of detection; and
   an elongated flexible printed circuit (FPC) folded at a plurality of predetermined corner locations to be provided as a frame along the four sides of the transparent panel;
   wherein the plurality of light emitting elements is provided on the elongated FPC along two adjacent sides of the transparent panel, and the plurality of light receiving elements is provided on the other two sides of the transparent panel so as to face the light emitting elements.

2. A touch panel as defined in claim 1, wherein:
a light emitting element mounting surface, at which the light emitting elements are mounted on the elongated FPC, and a light receiving element mounting surface, at which the light receiving elements are mounted on the elongated FPC, are parallel to the main surface of the transparent panel and provided on opposite sides with respect to each other.

3. A touch panel as defined in claim 1, wherein:
a frame shaped bezel is provided on the periphery of the transparent panel;
one of the light emitting element mounting surface and the light receiving element surface being provided on an upper surface of the bezel; and
the other of the light emitting element mounting surface and the light receiving element surface is provided on a lower side of the bezel.

4. A touch panel as defined in claim 3, wherein:
the elongated FPC is mounted onto the bezel by double sided adhesive tape.

5. A touch panel as defined in claim 2, wherein:
a frame shaped bezel is provided on the periphery of the transparent panel;
one of the light emitting element mounting surface and the light receiving element surface being provided on an upper surface of the bezel; and
the other of the light emitting element mounting surface and the light receiving element surface is provided on a lower side of the bezel.

6. A touch panel as defined in claim 5, wherein the elongated FPC is mounted onto the bezel by double sided adhesive tape.

* * * * *